United States Patent
Li et al.

(10) Patent No.: US 12,154,494 B2
(45) Date of Patent: Nov. 26, 2024

(54) TRANSPARENT DISPLAY SUBSTRATE AND DISPLAY DEVICE

(71) Applicants: Hefei BOE Joint Technology Co., Ltd., Anhui (CN); BOE Technology Group Co., Ltd., Beijing (CN)

(72) Inventors: Meng Li, Beijing (CN); Yongqian Li, Beijing (CN); Chen Xu, Beijing (CN); Jingquan Wang, Beijing (CN); Dacheng Zhang, Beijing (CN); Yu Wang, Beijing (CN); Zhidong Yuan, Beijing (CN); Zhenhua Qiu, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/772,955

(22) PCT Filed: May 13, 2021

(86) PCT No.: PCT/CN2021/093629
§ 371 (c)(1),
(2) Date: Apr. 28, 2022

(87) PCT Pub. No.: WO2021/249105
PCT Pub. Date: Dec. 16, 2021

(65) Prior Publication Data
US 2024/0161687 A1      May 16, 2024

(30) Foreign Application Priority Data

Jun. 9, 2020   (CN) .......................... 202010520235.9

(51) Int. Cl.
G09G 3/3225   (2016.01)
H10K 59/131   (2023.01)

(52) U.S. Cl.
CPC ......... *G09G 3/3225* (2013.01); *H10K 59/131* (2023.02); *G09G 2300/0408* (2013.01);
(Continued)

(58) Field of Classification Search
CPC .................................................. G09G 3/3225
See application file for complete search history.

(56) References Cited

U.S. PATENT DOCUMENTS 6,011,531 A       1/2000   Mei et al.
2014/0306200 A1*  10/2014  Jinta .................... H10K 59/353
                                                      257/40
(Continued)

FOREIGN PATENT DOCUMENTS

CN        102881689 A    1/2013
CN        108877651 A    11/2018
(Continued)

*Primary Examiner* — Chun-Nan Lin
(74) *Attorney, Agent, or Firm* — IPro, PLLC

(57) ABSTRACT

A display substrate and a display device are provided. The display substrate includes a base substrate, a plurality of pixels, a plurality of gate lines and a plurality of data lines, wherein the base substrate has a plurality of transparent regions and a plurality of display regions; the pixels are on the base substrate and within the display regions; each pixel includes a plurality of sub pixels; the sub pixels of each pixel are divided into two rows of sub pixels; the gate lines and the data lines are on the base substrate; the sub pixels of a first pixel are connected with the same gate line; the gate line connected with the sub pixels of the first pixel is between the two rows of sub pixels of the first pixel; and the first pixel is any one of the plurality of pixels.

20 Claims, 12 Drawing Sheets

(52) U.S. Cl.
CPC ............... *G09G 2300/0452* (2013.01); *G09G 2300/0842* (2013.01)

(56) References Cited

U.S. PATENT DOCUMENTS

| | | | |
|---|---|---|---|
| 2015/0035738 A1* | 2/2015 | Hirota | G09G 3/2003 345/88 |
| 2016/0189591 A1* | 6/2016 | Yoon | G09G 3/3225 345/690 |
| 2019/0035334 A1 | 1/2019 | Lin et al. | |
| 2021/0134223 A1* | 5/2021 | Li | G09G 3/3266 |
| 2021/0201787 A1 | 7/2021 | Yuan et al. | |
| 2022/0045161 A1 | 2/2022 | Li et al. | |

FOREIGN PATENT DOCUMENTS

| | | |
|---|---|---|
| CN | 109698225 A | 4/2019 |
| CN | 110718575 A | 1/2020 |
| CN | 210489212 U | 5/2020 |
| CN | 111524945 A | 8/2020 |
| CN | 111653591 A | 9/2020 |

\* cited by examiner

TRANSPARENT DISPLAY SUBSTRATE AND DISPLAY DEVICE

CROSS-REFERENCE TO RELATED APPLICATION

The present application is a 371 of PCT Patent Application Serial No. PCT/CN2021/093629, filed on May 13, 2021, which claims the priority to Chinese Patent Application No. 202010520235.9, filed on Jun. 9, 2020 and entitled "DISPLAY SUBSTRATE AND DISPLAY DEVICE", the entire contents of both of which are incorporated herein by reference.

TECHNICAL FIELD

The present disclosure relates to the field of display technologies, and particularly to a display substrate and a display device.

BACKGROUND

A transparent OLED (Organic Light-Emitting Diode) display panel refers to a display panel that achieves a display function by using an organic light-emitting material and has a see-through effect, and a user may simultaneously see an image displayed in the transparent OLED display panel and a scene behind the transparent OLED display panel.

SUMMARY

An embodiment of the present disclosure provides a display substrate and a display device.

In an aspect, a display substrate is provided. The display substrate includes:
  a base substrate, wherein the base substrate has a plurality of transparent regions and a plurality of display regions, and the transparent regions and the display regions alternate with each other in a first direction;
  a plurality of pixels, wherein the pixels are on the base substrate and within the display regions, pixels within each of the display regions are arranged in a second direction, each pixel includes a plurality of sub pixels, the sub pixels of each pixel are divided into two rows of sub pixels, the sub pixels in each row are arranged in the first direction, and the first direction intersects the second direction; and
  a plurality of gate lines and a plurality of data lines, wherein the gate lines and the data lines are on the base substrate, the gate lines extend along the first direction, and the data lines extend along the second direction;
  wherein the sub pixels of a first pixel are connected with the same gate line, the gate line connected with the sub pixels of the first pixel is between the two rows of sub pixels of the first pixel, and the first pixel is any one of the plurality of pixels.

Optionally, the gate line corresponding to the first pixel includes a first gate line and a second gate line, a plurality of sub pixels of the first pixel are respectively connected with the first gate line, and a plurality of sub pixels of the first pixel are respectively connected with the second gate line; and
  both the first gate line and the second gate line are between the two rows of sub pixels of the first pixel.

Optionally, the sub pixels of each pixel are divided into two groups of sub pixels;
  the first pixel corresponds to a plurality of data lines, and the sub pixels of the first pixel are connected with different data lines, respectively; and
  the data lines are between the two groups of sub pixels of the first pixel, and the sub pixels in each group are arranged in in the second direction.

Optionally, the display substrate further includes:
  a plurality of power supply signal lines, wherein the power supply signal lines extend along the second direction; and
  the sub pixels of the first pixel are connected with the same power supply signal line, the power supply signal line connected with the sub pixels of the first pixel is between the two groups of sub pixels of the first pixel.

Optionally, two data lines connected with one group of sub pixels of the first pixel are arranged on each side of the power supply signal line connected with the sub pixels of the first pixel.

Optionally, the data lines on the first side of the power supply signal line are connected with a group of sub pixels on the first side of the power supply signal line, respectively, and the first side of the power supply signal line is any side of the power supply signal line.

Optionally, each sub pixel includes an active layer, a first electrode layer and a second electrode layer, which are stacked in sequence and insulated from one another; the first electrode layer and the second electrode layer are one of a gate electrode layer and a source-drain electrode layer, respectively; and
  each power supply signal line includes two sub layers, and the two sub layers are on the same layer as the first electrode layer and the second electrode layer, respectively.

Optionally, the display substrate further includes:
  a plurality of sense lines, wherein the sense lines extend along the second direction; and
  the sub pixels of the first pixel are connected with the same sense line, the sense line connected with the sub pixels of the first pixel is between the first pixel and a neighboring pixel of the first pixel.

Optionally, the display substrate further includes:
  a plurality of sense leads, wherein the sub pixels of the first pixel are connected with the sense line through a plurality of sense leads, respectively.

Optionally, the display substrate further includes:
  a shading pattern, wherein the shading pattern is on the base substrate; and
  the sense leads are on the same layer as the shading pattern.

Optionally, each sub pixel includes a 3T1C pixel circuit and a light-emitting unit;
  the 3T1C pixel circuit includes a first transistor, a second transistor, a third transistor and a capacitor;
  a control electrode of the first transistor is electrically connected with the first gate line; a first electrode of the first transistor is electrically connected with the data line; a second electrode of the first transistor is electrically connected with a control electrode of the second transistor and one end of the capacitor, respectively; a first electrode of the second transistor is electrically connected with the power supply signal line; a second electrode of the second transistor is electrically connected with a second electrode of the third transistor, the other end of the capacitor and the light-emitting unit, respectively; a control electrode of the third transistor is electrically connected with the second gate line; and a first electrode of the third transistor is electrically connected with the sense line.

Optionally, the sub pixels included in each pixel are a red sub pixel, a green sub pixel, a blue sub pixel and a white sub pixel, respectively.

In another aspect, a display device is provided. The display device includes the display substrate according to the above aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Embodiments of the present application will be described in further detail with reference to the enclosed drawings, to more clearly present the objects, technical solutions and advantages of the present disclosure.

OLED display panels may be divided into PMOLED (Passive Matrix Driving OLED) display panels and AMOLED (Active Matrix Driving OLED) display panels according to driving modes, and the solutions provided by the present disclosure are mainly applied to AMOLED display panels.

Figure 1:
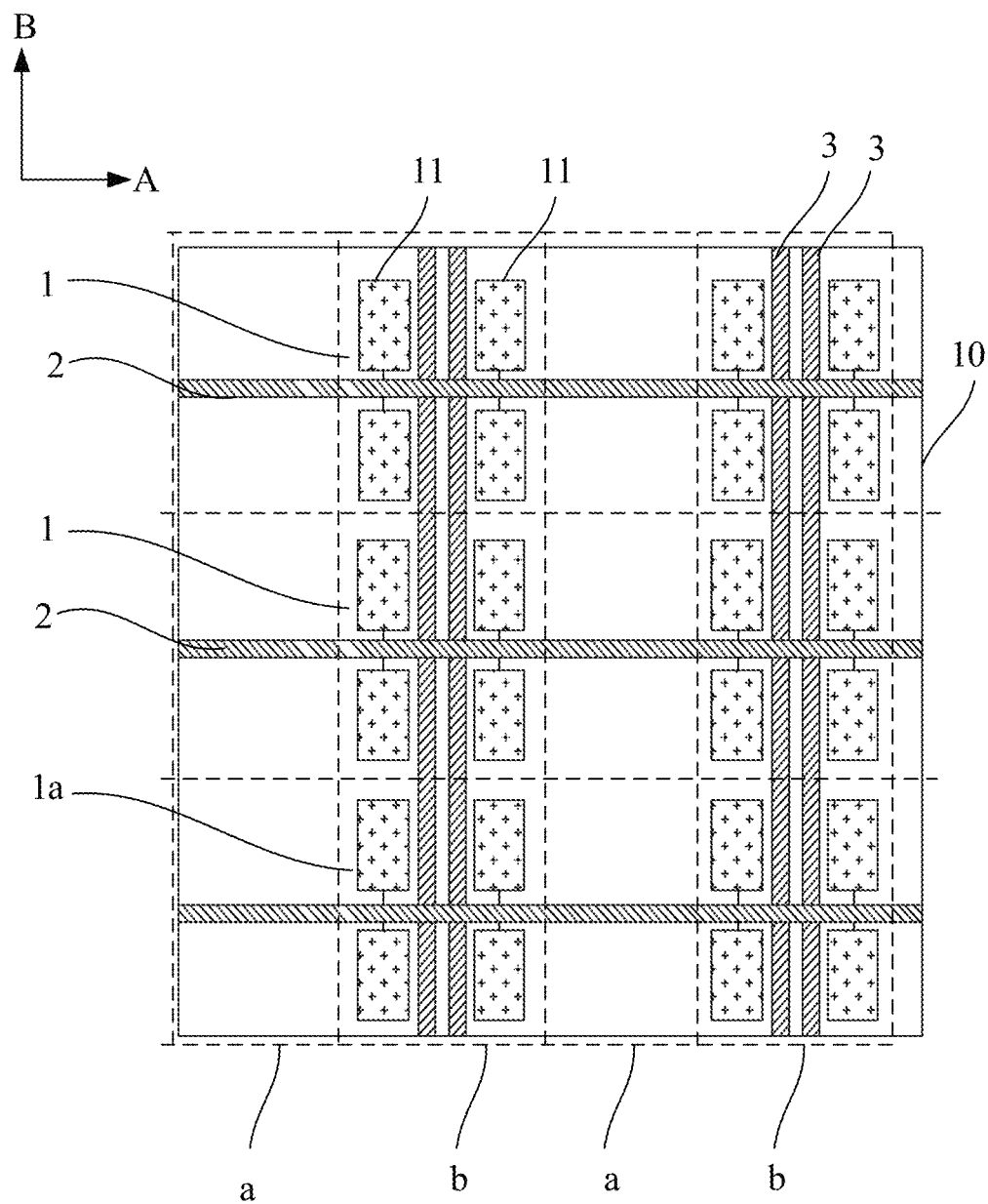
FIG. 1 is a schematic structural diagram of a display substrate according to an embodiment of the present disclosure.

FIG. 1 is a schematic structural diagram of a display substrate according to an embodiment of the present disclosure. Referring to FIG. 1, the display substrate includes a base substrate 10, a plurality of pixels 1, a plurality of gate lines 2 and a plurality of data lines 3, wherein the base substrate 10 has a plurality of transparent regions a and a plurality of display regions b, and the transparent regions and the display regions alternate with each other in a first direction A;

the pixels 1 are on the base substrate 10 and within the display regions b, the pixels 1 within each of the display regions b are arranged in a second direction B, each pixel 1 includes a plurality of sub pixels 11, the sub pixels of each pixel 1 are divided into two rows of sub pixels 11, the sub pixels 11 in each row are arranged in the first direction A, and the first direction A intersects the second direction B;

the gate lines 2 and the data lines 3 are on the base substrate 10, the gate lines 2 extend along the first direction A, and the data lines 3 extend along the second direction B; and the sub pixels 11 of a first pixel 1a are connected with the same gate line 2, the gate line 2 connected with the sub pixels 11 of the first pixel 1a is between the two rows of sub pixels 11 of the first pixel 1a, and the first pixel 1a is any one of the plurality of pixels 1.

In a display panel made using the display substrate, a scene behind the display panel may be seen through the transparent regions a, while the display regions b display a picture by controlling OLEDs to emit light.

When the display panel operates, each sub pixel acquires a scanning signal via the gate line connected with the sub pixel, acquires a data signal via the data line connected with the sub pixel, and drives the corresponding OLED to emit light under the action of the scanning signal and the data signal. In the related art, different rows of sub pixels are configured with gate lines respectively and are connected with different gate lines. In this way, on the one hand, the gate lines occupy a larger area of the display regions, resulting in a small number of sub pixels that may be arranged and a low resolution; and at the same time, the gate lines occupy a larger area of the transparent regions when passing through the transparent regions, resulting in a low proportion of the transparent regions in the display panel. However, in the embodiment of the present disclosure, the four sub pixels of each pixel are connected with the same gate line, so that the number of the gate lines is reduced, the area of the transparent regions occupied by the gate lines is reduced, and the proportion of the transparent regions in the display panel can be increased; at the same time, the gate lines are arranged between two rows of sub pixels, so that wiring is facilitated, and the uniformity of signals provided by the gate lines to the sub pixels can also be ensured; and in addition, the area of the display regions occupied by the gate lines is reduced, so that more sub pixels can be arranged on the display panel to improve the resolution.

In an exemplary embodiment, the gate lines are parallel to one another, and the data lines are parallel to one another.

In an exemplary embodiment, as shown in FIG. 1, the first direction A is a transverse direction, the second direction B is a vertical direction, correspondingly, the sub pixels in each row (i.e., a row of sub pixels) are arranged in the transverse direction, and the sub pixels in each group (i.e., a column of sub pixels) are arranged in the vertical direction. In each display region b, the plurality of pixels are arranged in a column direction to constitute a column of pixels. Exemplary embodiments of the present disclosure will be described with the transverse direction being the first direction and the vertical direction being the second direction.

In other embodiments, the first direction A may be the vertical direction, the second direction B may be the transverse direction, correspondingly, the sub pixels in each row are arranged in the vertical direction, and the sub pixels in each group are arranged in the transverse direction.

In an exemplary embodiment, the sub pixels 11 of each pixel 1 are divided into two groups of sub pixels 11. For example, the sub pixels of each pixel 1 may be divided into two rows and two groups, that is, each pixel 1 includes four sub pixels that are arranged in a square pattern as shown in FIG. 1.

In other embodiments, the sub pixels 11 of each pixel 1 may also be divided into 3 or more groups of sub pixels 11, or any two rows of sub pixels 11 are staggered from each other so that the sub pixels 11 within the pixel 1 are not arranged in such groups.

Figure 2:
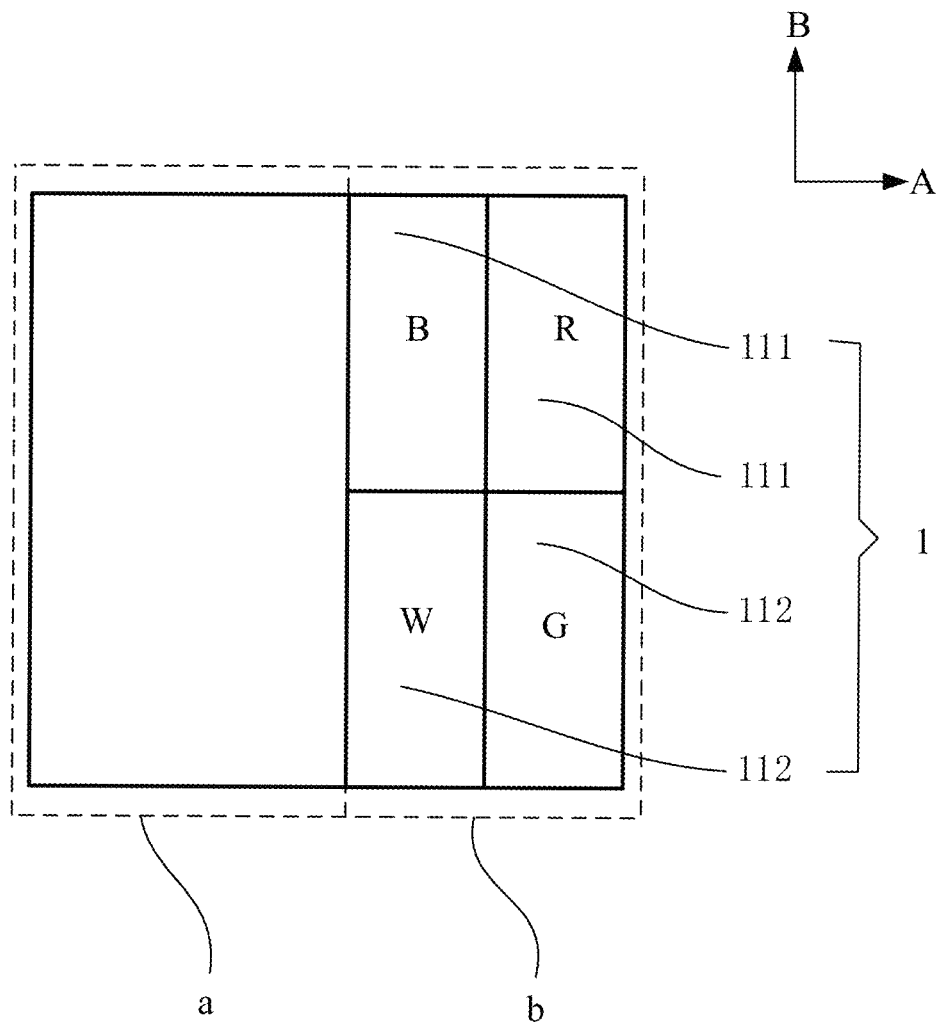
FIG. 2 is a partially enlarged schematic structural diagram of a display substrate according to an embodiment of the present disclosure.

FIG. 2 is a partially enlarged schematic structural diagram of a display substrate according to an embodiment of the present disclosure. As shown in FIG. 2, each pixel 1 includes a plurality of sub pixels 11; the sub pixels 11 of each pixel 1 are divided into two rows of sub pixels 11; the sub pixels 11 in each row are arranged in the first direction A; one of the two rows of sub pixels 11 is a row of first sub pixels 111, and the other of the two rows of sub pixels 11 is a row of second sub pixel 112; and each pixel 1 includes at least one first sub pixel 111 and at least one second sub pixel 112, that is, the sub pixels each pixel 1 includes are divided into two rows.

Referring to FIG. 2 again, the sub pixels 11 each pixel 1 includes are red (R), green (G), blue (B) and white (W) sub pixels, respectively. The sub pixels are arranged in a square pattern.

In an embodiment of the present disclosure, two first sub pixels 111 are blue and red sub pixels, respectively, and two second sub pixels 112 are white and green sub pixels, respectively.

The display substrate provided by an exemplary embodiment of the present disclosure is an OLED display substrate. In the OLED display substrate, each sub pixel includes a pixel circuit and a light-emitting element, wherein the pixel circuit is between the base substrate and the light-emitting element; the light-emitting element includes a first electrode, an organic light-emitting layer and a second electrode, which are stacked in sequence; and the second electrode is on the side of the organic light-emitting layer, which faces the base substrate. The second electrode is a positive electrode, and the first electrode is a negative electrode, The pixel circuit includes at least two thin film transistors. Taking a top gate type thin film transistor as an example, each thin film transistor includes an active layer disposed on the base substrate, a gate electrode layer disposed on the side of the active layer away from the base substrate, a source-drain electrode layer disposed on the side of the gate electrode layer away from the base substrate, and the like. The following descriptions all take the top gate type thin film transistor as an example for illustration; and in other embodiments, the thin film transistors may also be bottom gate type thin film transistors or double gate type thin film transistors, and the present disclosure is not limited thereto.

In an exemplary embodiment, the pixel circuit is a 2T1C circuit, a 3T1C circuit, a 7T1C circuit or the like. Generally, the 2T1C circuit may only realize a relatively simple light-emitting control function. The 3T1C circuit may not only realize light-emitting control, but also compensate the thin film transistors in the pixel circuit through an external compensation technology so as to improve the display quality. Due to a complex structure, the 7T1C circuit may result in an excessively small area of the transparent regions and a lower resolution when used in the transparent OLED display substrate. In the embodiments of the present disclosure, the 3T1C circuit is selected as the pixel circuit in the transparent OLED display substrate, wherein T represents transistor, and C represents capacitor.

Figure 3:
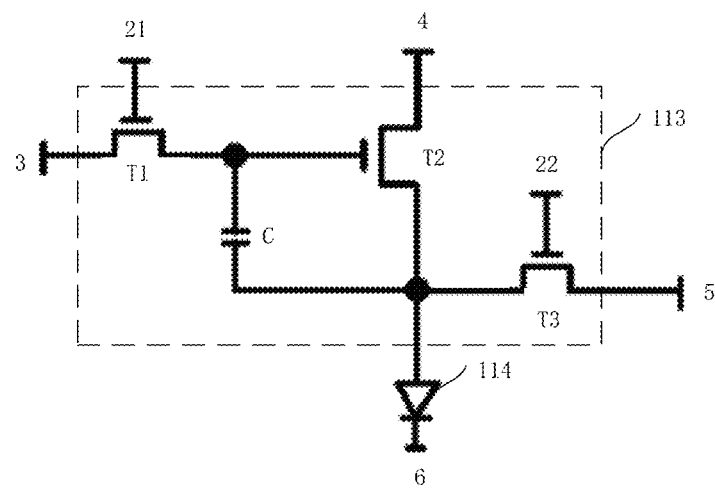
FIG. 3 is a circuit diagram of a sub pixel according to an embodiment of the present disclosure.

The structure of a sub pixel provided by an embodiment of the present disclosure will be first described as follows with reference to FIG. 3:

FIG. 3 is a circuit diagram of a sub pixel according to an embodiment of the present disclosure. Referring FIG. 3, the sub pixel 11 includes a 3T1C pixel circuit 113 and a light-emitting unit 114.

The 3T1C pixel circuit includes a first transistor T1, a second transistor T2, a third transistor T3 and a capacitor C.

A control electrode of the first transistor T1 is electrically connected with the first gate line 21; a first electrode of the first transistor T1 is electrically connected with the data line 3; a second electrode of the first transistor T1 is electrically connected with a control electrode of the second transistor T2 and one end of the capacitor C, respectively; a first electrode of the second transistor T2 is electrically connected with the power supply signal line (VVD line) 4; a second electrode of the second transistor T2 is electrically connected with a second electrode of the third transistor T3, the other end of the capacitor C and the light-emitting unit 114, respectively; a control electrode of the third transistor T3 is electrically connected with the second gate line 22; and a first electrode of the third transistor T3 is electrically connected with the sense line 5.

In an exemplary embodiment, the transistors are thin film transistors; the control electrodes of the thin film transistors are gate electrodes; and each first electrode and each second electrode are one of an active electrode and a drain electrode, respectively.

In an exemplary embodiment, the light-emitting unit 114 is an OLED, a positive electrode of the OLED is connected with the other end of the capacitor C, and a negative electrode of the OLED is connected with a common power supply line (VSS line) 6.

In the 3T1C pixel circuit, the control electrode of the first transistor T1 acquires a scanning signal from the first gate line 21; the first electrode of the first transistor T1 acquires a data signal from the data line 3, and outputs the data signal to the control electrode of the second transistor T2 through the second electrode of the first transistor T1; and the first electrode of the second transistor T2 acquires a power supply signal from the power supply signal line 4 so as to drive the OLED connected with the second electrode of the second transistor T2 to emit light.

When the OLED display panel operates, the voltage difference between the positive electrode and the negative electrode of the OLED should maintain a theoretical voltage difference. However, during the use of the OLED, a drop of power supply voltage is generated due to factors such as process condition, external environment, service time and the like, so that the voltage difference actually applied to the two ends of the OLED is different from the theoretical voltage difference between the two ends of the OLED, which then affects the display effect of the transparent OLED display panel. The calculation of compensation voltage for the voltage difference may be achieved by arranging an external compensation circuit controlled by the third transistor T3. At a sensing stage, the first gate line 21 and the second gate line 22 simultaneously control the first transistor T1 and the third transistor T3 to be turned on; the data line 3 provides a low-level signal (the low-level signal is lower than the conduction voltage of the second thin film crystal T2, for example, 2V) for the sub pixel; and at this moment, the second thin film transistor T2 is not turned on, and the data line 3 charges the sense line 5 via the capacitor C and the third transistor T3, so that an external IC (Integrated Circuit) can calculate the compensation voltage of the sub pixel based on the electrical signal acquired by the sense line 5.

Figure 4:
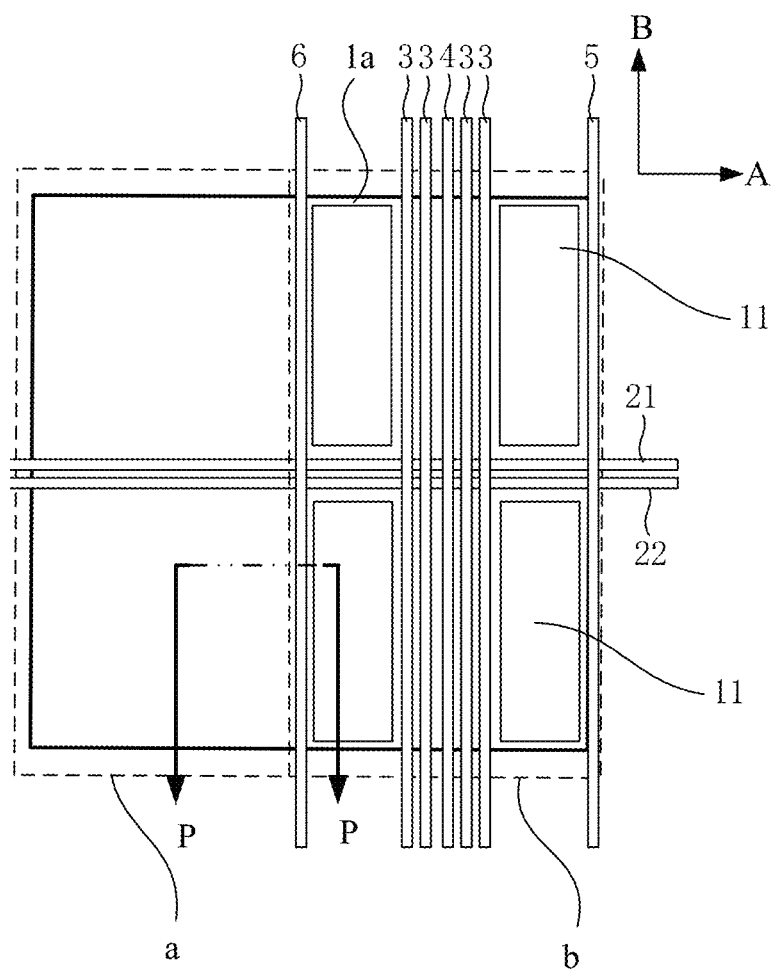
FIG. 4 is a partially enlarged schematic structure diagram of a display substrate according to an embodiment of the present disclosure.

FIG. 4 is a partially enlarged schematic structural diagram of a display substrate according to an embodiment of the present disclosure. Referring to FIG. 4, the gate line 2 corresponding to the first pixel 1a includes the first gate line 21 and the second gate line 22, the first transistors T in the sub pixels of the first pixel 1a are respectively connected with the first gate line 21, and the third transistors T3 in the sub pixels 11 of the first pixel 1a are respectively connected with the second gate line 22; and both the first gate line 21 and the second gate line are between the two rows of sub pixels 11 of the first pixel 1a.

In the embodiment, the two gate lines are both arranged between the two rows of sub pixels 11, and there is no need to configure the two rows of sub pixels with gate lines, respectively, (if the two rows of sub pixels are configured with gate lines, respectively, four gate lines would be required in total), so that the number of the gate lines is reduced, and the areas of the transparent regions and the display regions occupied by the grid lines are reduced.

Referring to FIG. 4 again, the first pixel 1a corresponds to the data lines 3, and the sub pixels 11 of the first pixel 1a are connected with different data lines, respectively, that is, the sub pixels 11 are connected one to one to the data lines 3.

The data lines 3 are between the two groups of sub pixels 11 of the first pixel 1a, and the sub pixels in each group are arranged in the second direction B.

In the embodiment, each sub pixel in the same pixel is driven by one data line; and when arranged in a square pattern, the four sub pixels within the same pixel may be ensured to emit light at the same time, and time-sharing driving is not needed to ensure that the scanning time of each row of pixels is short, so that the solution can be applied to a large-size high-resolution display screen.

In addition, since the data lines 3 are arranged between the two groups of sub pixels 11, one the one hand, the transparent regions of the display substrate are not affected, and on the other hand, a simple design of wiring from the sub pixels to the four data lines can be ensured to facilitate the production.

Referring to FIG. 4 again, the display substrate may further include a plurality of power supply signal lines 4 (only one is shown).

The power supply signal lines 4 extend along the second direction B; the sub pixels 11 of the first pixel 1a are connected with the same power supply signal line 4; and the power supply signal line 4 connected with the sub pixels 11 of the first pixel 1a is between the two groups of sub pixels 11 of the first pixel 1a.

In an embodiment of the present disclosure, the four sub pixels of each pixel is connected with the same power supply signal line 4, which can greatly reduce the number of the power supply signal lines and reduces the area of the display regions occupied by the power supply signal lines, so that more sub pixels can be arranged on the display panel to improve the resolution. In addition, the power supply signal line 4 is arranged between the two groups of sub pixels 11, which facilitates the connection of the sub pixels and the power supply signal line 4 on the one hand and can ensure the uniformity of signals provided by the power supply signal line to the sub pixels on the other hand.

The power supply signal lines 4 are used for providing electric power for the OLEDs in the transparent OLED display panel.

Referring FIG. 4 again, the data lines 3 connected with one group of sub pixels 11 of the first pixel 1a are arranged on each side of the power supply signal line 4 connected with the sub pixels 11 of the first pixel 1a.

For example, two data lines 3 connected with 2 sub pixels 11 of the first pixel 1a are arranged on each side of the power supply signal line 4 connected with the 4 sub pixels 11 of the first pixel 1a.

This design ensures that the power supply signal line is between the two groups of sub pixels 11, thereby further ensuring the uniformity of signals provided by the power supply signal line to the sub pixels.

In an embodiment of the present disclosure, the data lines 3 on the first side of the power supply signal line 4 are connected with the group of sub pixels 11 on the first side of the power supply signal line 4, respectively, and the first side of the power supply signal line 4 is any side of the power supply signal line 4.

In an exemplary embodiment, in FIG. 4, the sub pixel 11 at the top left corner is connected with the leftmost one of the 4 data lines; the sub pixel 11 at the bottom left corner is connected with the second one of the 4 data lines from left to right; the sub pixel 11 at the bottom right corner is connected with the third one of the 4 data lines from left to right; and the sub pixel 11 at the top right corner is connected with the rightmost one of the 4 data lines. That is, the 4 sub pixels 11 are sequentially connected with the 4 data lines from left to right in a counterclockwise order, respectively. Such a wiring solution can reduce drilling and winding designs among metal lines, thereby increasing the product yield.

Since the number of the data lines 3 is greater than that of the power supply signal line 4, the power supply signal line 4 is arranged in the middle of the data lines 3 to make each of the two groups of sub pixels 11 be close to the corresponding two data lines 3, thus avoiding the case that the data lines 3 are connected with the sub pixels 11 across the power supply signal line 4, facilitating wiring and improving production efficiency.

Referring to FIG. 4 again, the display substrate may further include a plurality of sense lines 5 (only one is shown).

The sense lines 5 extend along the second direction B; the sub pixels 11 of the first pixel 1a are connected with the same sense line 5; and the sense line 5 connected with the sub pixels 11 of the first pixel 1a is between the first pixel 1a and a neighboring pixel of the first pixel 1. That is, the sense line 5 is on one side of the first pixel 1a.

In an embodiment of the present disclosure, the sub pixels 11 of each pixel are connected with the same sense line 5 and share the same sense line 5. The sense line 5 is used for sensing electric signals in the sub pixels, and in some embodiments, the sense line 5 may also be used for transmitting compensation voltage signals of the external compensation circuit. It can also be regarded as that every two adjacent groups of sub pixels 11 share the same sense line 5 in each display region b. Since the calculation of the compensation voltage in any sub pixel 11 can be realized individually by adjusting the voltage magnitudes of level signals of the data lines 3, of each pixel, only one sense line 5 rather than a plurality of sense lines 5 are needed to be connected with all the sub pixels in each group of pixels 1 to meet the requirements. Therefore, the area of the display regions b occupied by the sense lines 5 is reduced, and more sub pixels 11 can be arranged in the display regions b to improve the resolution.

Referring to FIG. 4 again, the display substrate may further include a plurality of common power supply lines 6 (only one is shown).

The common power supply lines 6 extend along the second direction B; the sub pixels 11 of the first pixel 1a are connected with the same common power supply line 6; and the common power supply line 6 connected with the sub pixels 11 of the first pixel 1a is between the first pixel 1a and another neighboring pixel 1. That is, the sense line 5 and the common power supply line 6 are on both sides of the first pixel 1a, respectively.

Since the sub pixels within each group of pixels is connected with one common power supply line 6, the area of the display regions b occupied by the common power supply lines is reduced, and more sub pixels 11 can be arranged in the display regions b to improve the resolution.

In an exemplary embodiment, as shown in FIG. 4, the common power supply line 6 is on the side of the display region 6 close to the transparent region a.

Figure 5:
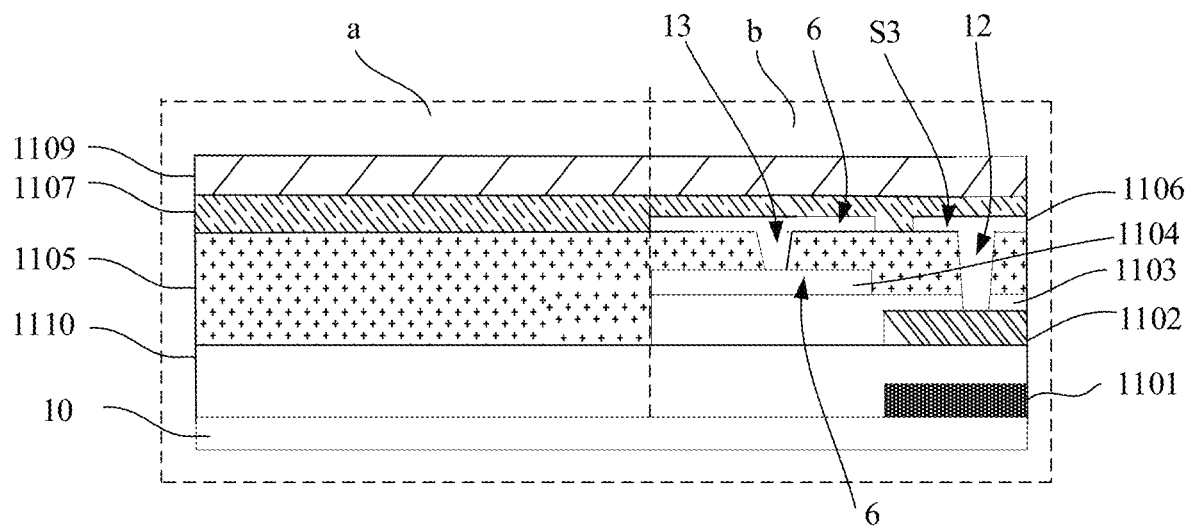
FIG. 5 is a cross-sectional view of a sub pixel according to an embodiment of the present disclosure.
Figure 6:
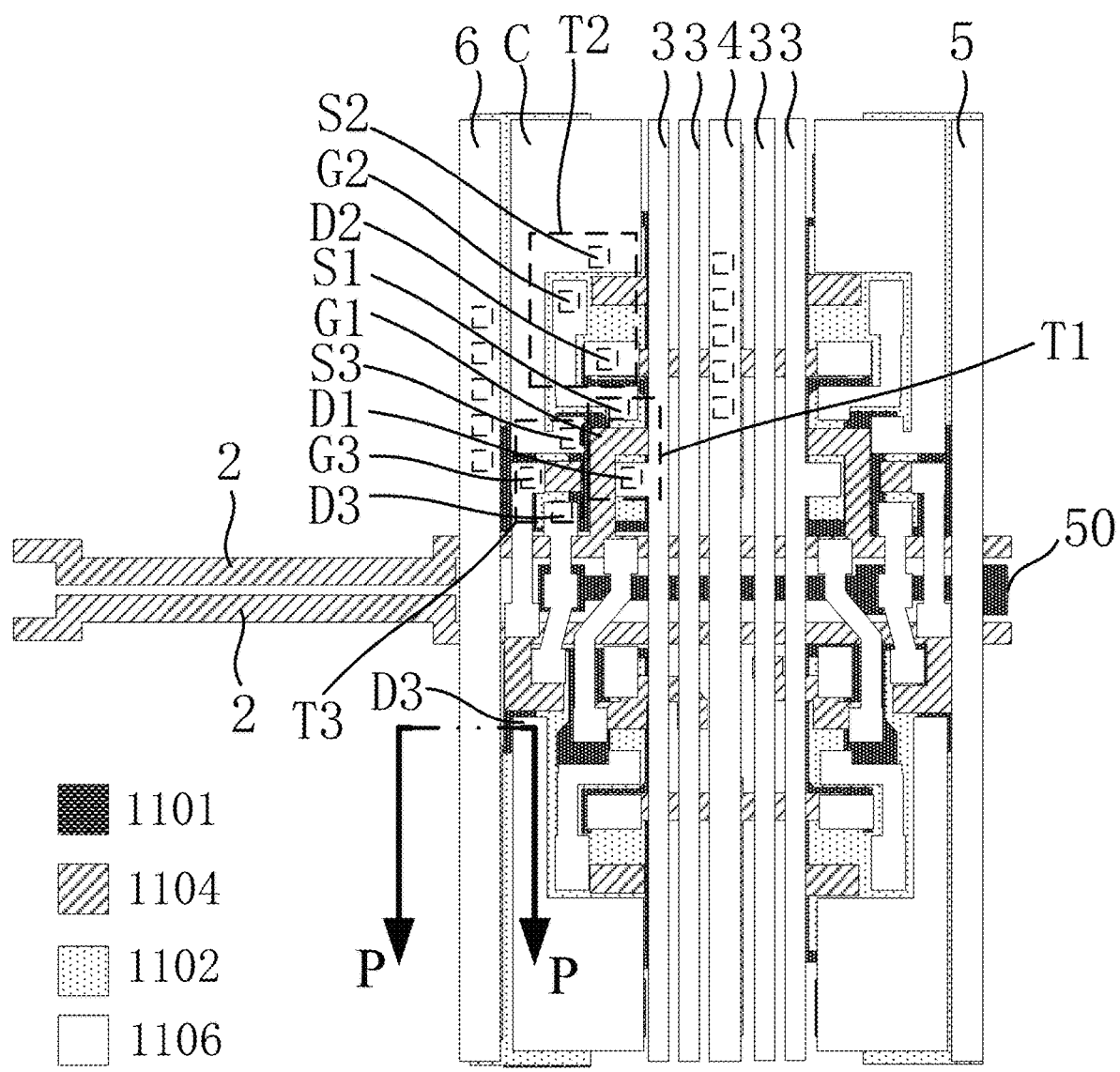
FIG. 6 is a schematic structural diagram of some film layers in a sub pixel.

FIG. 5 is a schematic cross-sectional view P-P of FIG. 4, and in order to facilitate the understanding, the cross-sectional position line P-P is also shown in FIG. 6, and the cross section passes through the common power supply line 6 (a joint of the double-layer common power supply line 6) and the source electrode S3. As shown in FIG. 5, each sub pixel 11 includes the base substrate 10, a shading layer 1101, an active layer 1102, a gate electrode insulation layer 1103, a first electrode layer 1104, an interlayer insulation layer 1105, a second electrode layer 1106 and a passivation layer 1107, which are stacked in sequence, wherein the source electrode S3 of the third thin film transistor T3 in the second electrode layer 1106 is connected with the active layer 1102 via a via hole 12; the part of the common power supply line 6 disposed at the second electrode layer 1106 is connected with the part of the common power supply line 6 disposed at the first electrode layer 1104 via a via hole 13 to form the double-layer common power supply line 6 in FIG. 4; and the first electrode layer 1104 is isolated from the active layer 1102 by the gate electrode insulation layer 1103.

In an exemplary embodiment, the base substrate is a transparent substrate, such as a glass substrate and the like. The material of the active layer 1102 may be at least one of InGaZnO, InGaO, ITZO and AlZnO. The gate electrode insulation layer 1103 and the interlayer insulation layer 1105 may be made from insulation materials, such as silicon nitride, silicon oxide and the like. The material of the passivation layer 1107 is a composite layer structure composed of any combination of two or more of silicon oxide, silicon nitride and a silicon nitride compound. The shading layer 1101, the first electrode layer 1104 and the second electrode layer 1106 are metal layers, such as Al, Cu, Mo, Cr, Ti, and the like, and may also be alloy electrode layers.

In an exemplary embodiment, a positive electrode layer (not shown in the figure) is arranged on the passivation layer 1107, and the positive electrode layer is connected with the source electrode S3 of the third thin film transistor T3 through a via hole, and is a metal layer or a conductive thin film layer.

Optionally, each sub pixel 11 further includes at least one of a planarization layer 1109 and a buffer layer 1110, wherein the planarization layer 1109 is between the passivation layer 1107 and the positive electrode layer; and the buffer layer 1110 is between the base substrate 10 and the active layer 1102. The buffer layer 1110 is generally a $SiO_2$ and $SiN_x$ layer, and may prevent metal ions in the glass substrate from entering polycrystalline silicon to affect the performance of the thin film transistors. The planarization layer 1109 is generally a resin layer and ensures the flatness between the metal positive electrode of the OLED and the passivation layer 1107.

It should be noted that in other embodiments, the positive electrode layer may also be directly connected with the active layer 1102 through a via hole. A sub pixel provided by an exemplary embodiment of the present disclosure further includes a pixel definition layer, a light-emitting layer and a negative electrode layer, the structures of these layers may be seen in the related art, and detailed descriptions thereof are omitted herein.

In an exemplary embodiment, the first electrode layer 1104 is a gate electrode layer, and the second electrode layer 1106 is a source-drain electrode layer.

In an embodiment of the present disclosure, each transparent region a includes the base substrate 10, a gate electrode insulation layer 1103, an interlayer insulation layer 1105 and a passivation layer 1107, which are stacked in sequence. The base substrate 10, the gate electrode insulation layer 1103, the interlayer insulation layer 1105 and the passivation layer 1107 in the transparent region a may be made at the same time and arranged at the same layer as the corresponding film layers in the display region b; and the difference may lie in that some film layers are different in thickness, for example, the gate insulating layer 1103 and the interlayer insulating layer 1105 in the transparent region a are both thicker than those in the display region b, and for another example, the gate insulating layer 1103 in the transparent region a is thicker than that in the display region b.

The circuit structure in the sub pixel will be described in detail as follows with reference to FIG. 6 to FIG. 10:

FIG. 6 is a schematic structural diagram of some film layers in the sub pixel. Referring to FIG. 6 which mainly shows the structures of the shading layer 1101, the active layer 1102, the first electrode layer 1104 and the second electrode layer 1106, G1 is the gate electrode of the first transistor T1, D1 is the drain electrode of the first transistor T1, and S1 is the source electrode of the first transistor T1; G2 is the gate electrode of the second transistor T2, D2 is the drain electrode of the second transistor T2, and S2 is the source electrode of the second transistor T2; and G3 is the gate electrode of the third transistor T3, D3 is the drain electrode of the third transistor T3, and S3 is the source electrode of the third transistor T3. Small squares in this figure represent connections based on via holes, for example, the sub layer of the power supply signal line 4 disposed at the second electrode layer is connected with the sub layer of the power supply signal line 4 disposed at the first electrode layer through a via hole to form a double-layer wiring power supply signal line 4. FIG. 6 only shows the via holes of the sub pixel at the top left corner, which are similar to those of the other sub pixels.

Figure 7:
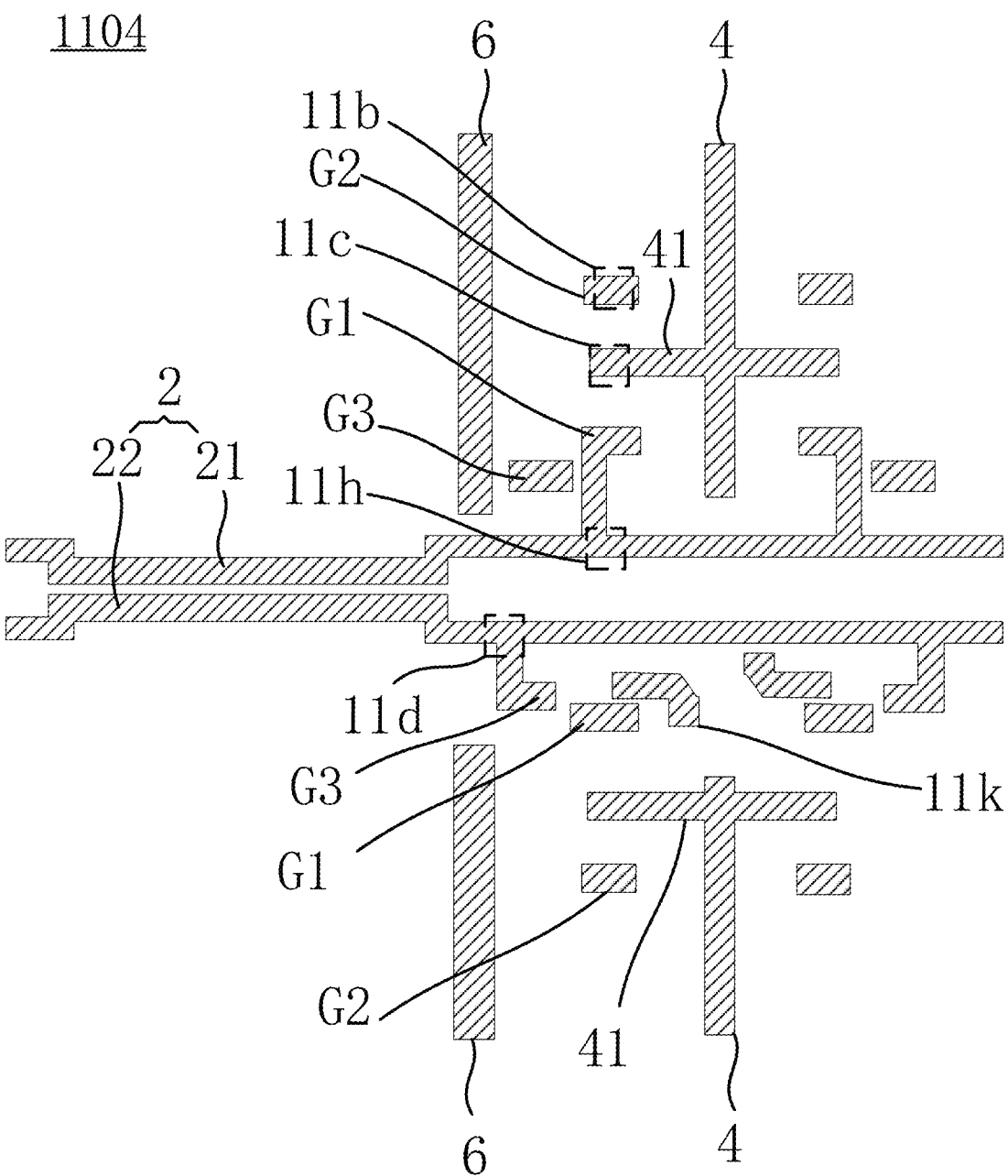
FIG. 7 is a schematic structural diagram of a first electrode layer according to an embodiment of the present disclosure.

FIG. 7 is a schematic structural diagram of a first electrode layer according to an embodiment of the present disclosure. As shown in FIG. 7, the first electrode layer 1104 is a gate electrode layer, and the first electrode layer 1104 may include a gate line 2 (e.g., including the above-described first gate line 21 and second gate line 22), the gate electrodes of the thin film transistors in the sub pixels (e.g., the gate electrode G1 of the first thin film transistor T1, the gate electrode G2 of the second thin film transistor T2 and the gate electrode G3 of the third thin film transistor T3), and parts of the power supply signal line 4 and the common power line 6 (forming double-layer wiring together with the second electrode layer).

Optionally, as shown in FIG. 7, the first electrode layer 1104 may further include the drain electrode D2 of the second transistor T2 and a connection line 41 of the power supply signal line 4.

Figure 8:
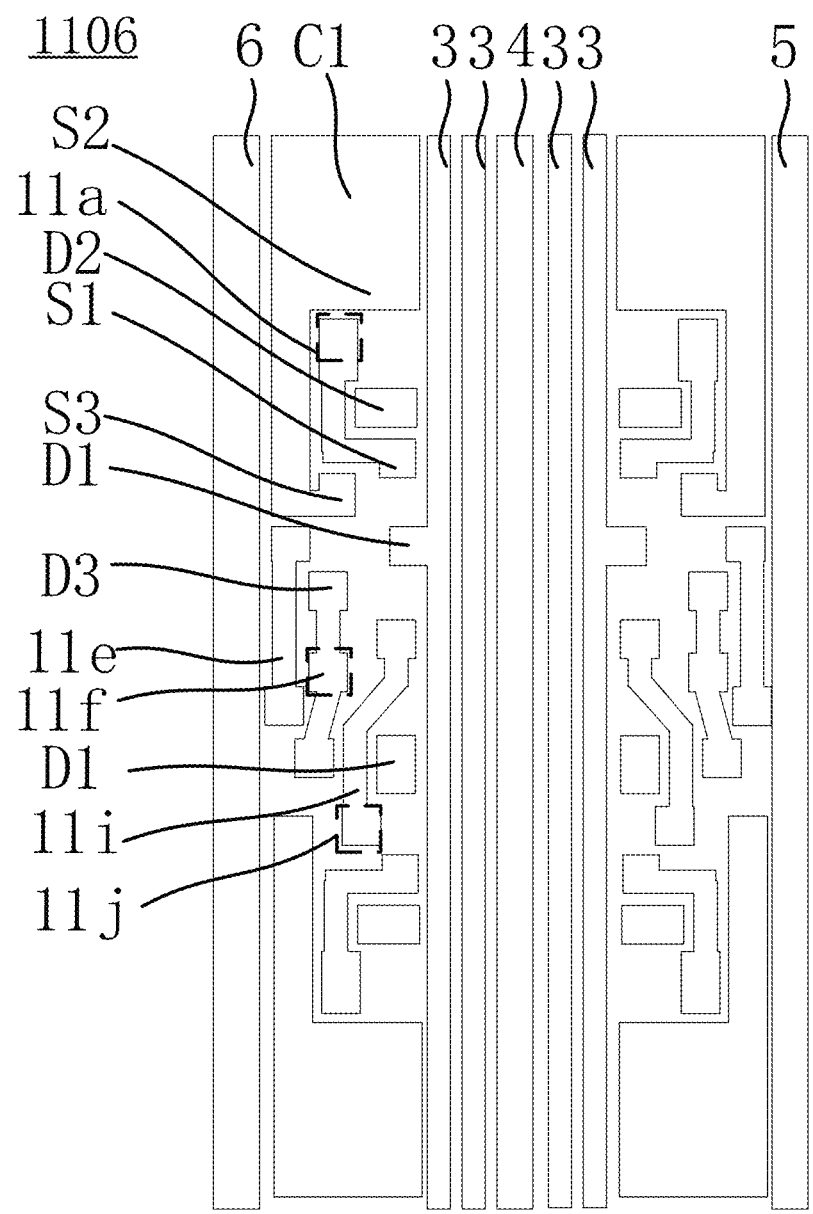
FIG. 8 is a schematic structural diagram of a second first electrode layer according to an embodiment of the present disclosure.

FIG. 8 is a schematic structural diagram of a second electrode layer according to an embodiment of the present disclosure. As shown in FIG. 8, the second electrode layer 1106 is a source-drain electrode layer; and the second electrode layer 1106 includes the data lines 3, the power supply signal line 4, the sensing line 5, the common power supply line 6, an electrode plate C1 of the capacitor C, and the source electrodes and drain electrodes in the thin film transistors (e.g., the source electrode S1 and drain electrode D1 of the first thin film transistor T1, the source electrode S2 and drain electrode D2 of the second thin film transistor T2 and the source electrode S3 and drain electrode D3 of the third thin film transistor T3).

Figure 9:
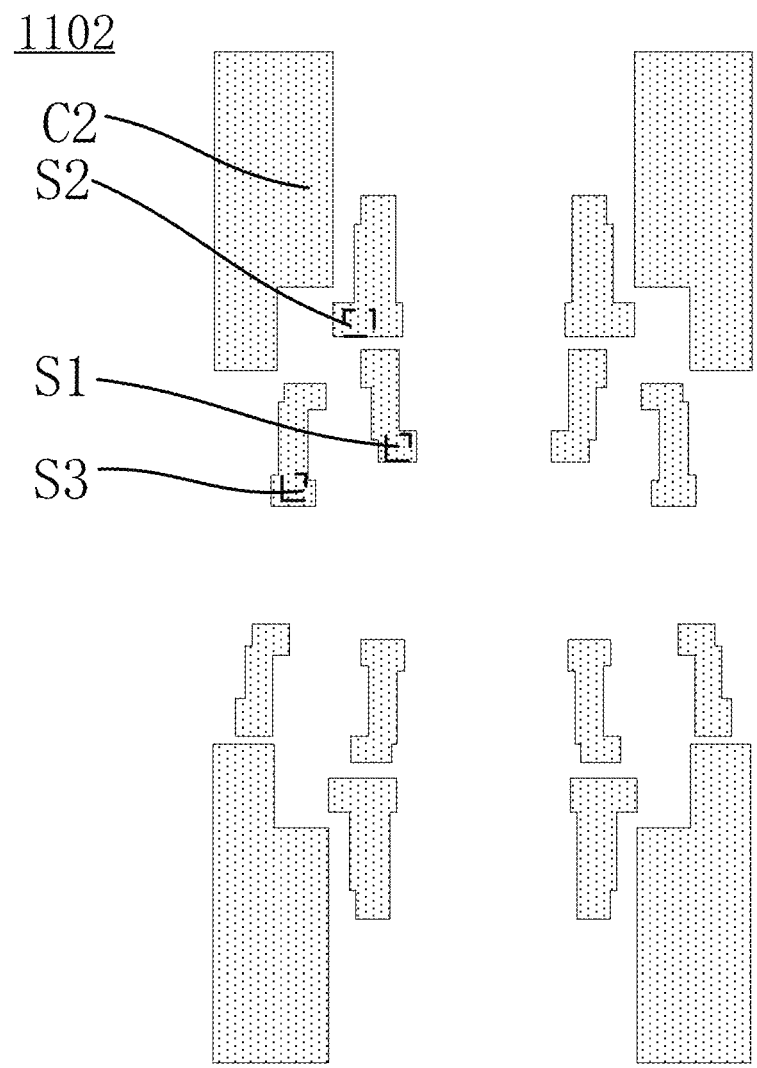
FIG. 9 is a schematic structural diagram of an active layer according to an embodiment of the present disclosure.

FIG. 9 is a schematic structural diagram of an active layer according to an embodiment of the present disclosure. As shown in FIG. 9, the regions of the active layer, which include the transistors, are metallized to form conductors to be connected with the second electrode layer to serve as parts of the source electrode S1 of the first transistor T1, the source electrode S2 of the second transistor T2 and the source electrode S3 of the third transistor T3. At the same time, another electrode plate C2 of the capacitor C is formed.

Figure 10:
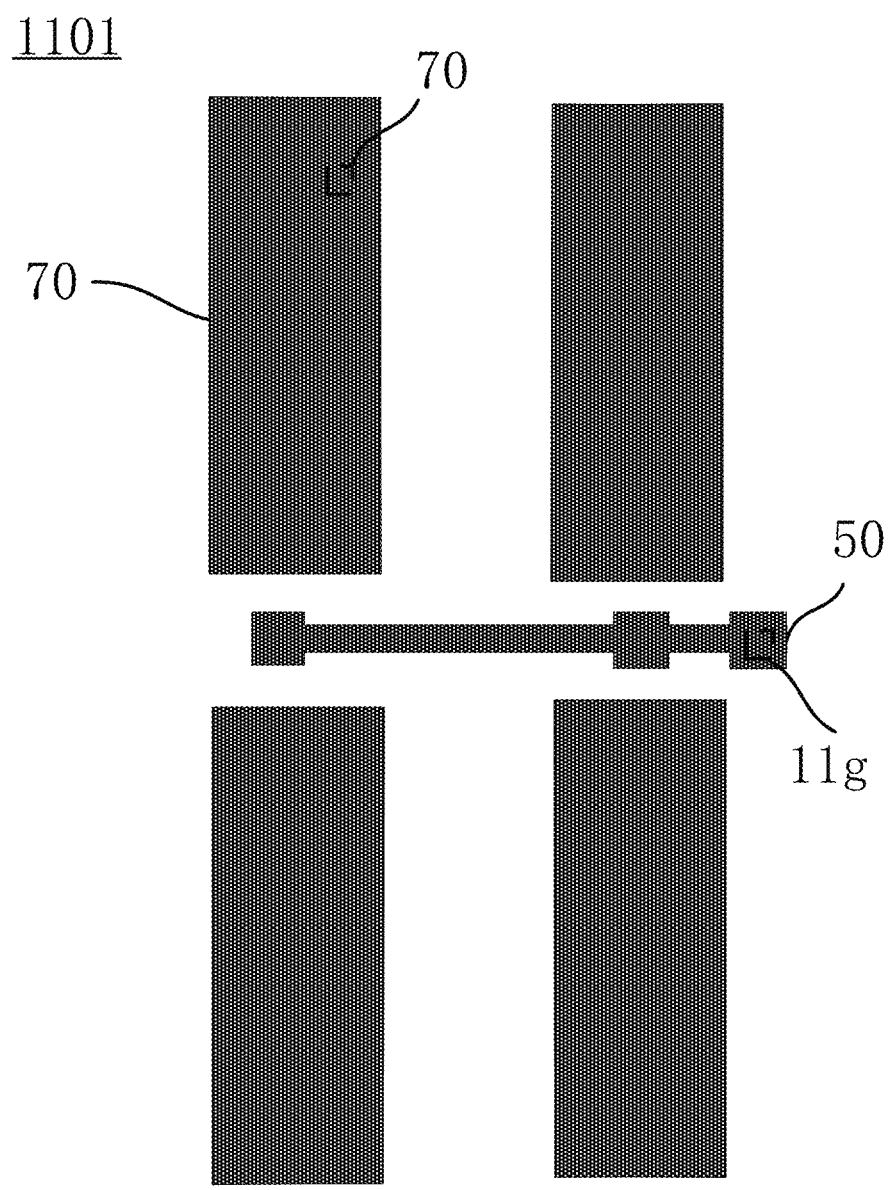
FIG. 10 is a schematic structural diagram of a shading layer according to an embodiment of the present disclosure.

FIG. 10 is a schematic structural diagram of a shading layer according to an embodiment of the present disclosure. As shown in FIG. 10, the shading layer 1101 includes a shading pattern 7 and sense leads 50, wherein the sub pixels 11 of the first pixel 1*a* are connected with the sense line 5 through the sense leads 50, respectively. In an exemplary embodiment, the shading pattern 7 is electrically connected with the source electrode S2 of the second transistor T2 through via holes, which avoids that the metal shading pattern 7 stays in a floating state. In an exemplary embodiment, connection points 70 of the shading pattern 7 are electrically connected with the source electrodes S2 of the second transistors T2 through via holes.

The connection relations among the film layers are described by taking the structures of the two sub pixels on the left side of the power supply signal line 4 in FIG. 6 for example (the two sub pixels on the right side and the two sub pixels on the left side are approximately symmetric).

In the sub pixel 11 at the top left corner:
- as shown in FIG. 7, the first gate line 21 is directly connected with the gate electrode G1 of the first thin film transistor T1; as shown in FIG. 8, the data line 3 is directly connected with the drain electrode D1 of the first thin film transistor T1; as shown in FIG. 8 and FIG. 9, a connection point 11*a* on the source electrode S1 of the first thin film transistor T1 in the second electrode layer 1106 is connected with the electrode plate C2 of the capacitor C in the active layer 1102 through a via hole;
- as shown in FIG. 7 and FIG. 9, a connection point 11*b* on the gate electrode G2 of the second thin film transistor T2 is connected with the electrode plate C2 of the capacitor C in the active layer 1102 through a via hole; as shown in FIG. 7 and FIG. 8, the part of the power supply signal line 4 disposed in the first electrode layer 1104 is connected with the connection line 41, a connection point 11*c* of the connection line 41 is connected with the drain electrode D2 of the second thin film transistor T2 in the second electrode layer 1106 via a via hole, and at the same time, the part of the power supply signal line 4 disposed in the first electrode layer 1104 is connected with the part of the power supply signal line 4 disposed in the second electrode layer 1106 via a plurality of via holes so as to form the double-layer power supply signal line 4; as shown in FIG. 8, the source electrode S2 of the second thin film transistor T2 is connected with the plate C1 of the capacitor C;
- as shown in FIG. 7 and FIG. 8, the second gate line 22 has a connection point 11*d*, the connection point 11*d* is connected with one end of a first line 11*e* in the second electrode layer 1106 via a via hole, and then the other end of the first line 11*e* is connected with the gate electrode G3 of the third thin film transistor T3 via a via hole; as shown in FIG. 8 and FIG. 10, a connection point 11*f* of the drain electrode D3 of the third thin film transistor T3 in the second electrode layer 1106 is connected with the sense lead 50 in the shading layer 1101 via a via hole, and a connection point 11*g* of the sense lead 50 is connected with the sense line 5 in the second electrode layer 1106 via a via hole; and as shown in FIG. 8, the source electrode S3 of the third thin film transistor T3 is connected with the electrode plate C1 of the capacitor C.

When the sub pixel operates, in a display stage, the first gate line 21 provides scanning signals for the gate electrode G1 of the first thin film transistor T1 to control the drain electrode D1 and the source electrode S1 of the first thin film transistor T1 to be turned on; and the data line 3 writes data signals into the electrode plate C2 of the capacitor C through the turned-on first thin film transistor T1. The electrode plate C2 of the capacitor C is connected with the gate electrode G2 of the second thin film transistor T2; when the electric potential of the gate electrode G2 of the second thin film transistor T2 is higher than a turn-on voltage, the drain electrode D2 and the source electrode S2 of the second thin film transistor T2 are turned on; and the power supply signal line 4 outputs driving signals via the second thin film transistor T2 to drive the OLED to emit light. In a sensing stage, first the first thin film transistor T1 is controlled to be turned on through the scanning signals, and at the same time, the third thin film transistor T3 is controlled to be turned on through the scanning signals provided by the second gate line 22; and then the capacitor C is charged, but the electric potential of the gate electrode G2 is lower than the turn-on voltage after the capacitor C is charged, and at this moment, the capacitor C may charge the sense line 5 via the third thin film transistor T3 to enable the sense line to sense the electric potential of the positive electrode of the OLED, so as to realize follow-up external compensation.

In the sub pixel 11 at the bottom left corner:
- the sub pixel 11 at the bottom left corner is different from that at the top left corner in that the second gate line 22 is directly connected with the gate electrode G3, a connection point 11*h* of the second gate line 21 is connected with a second line 11*i* of the second electrode layer 1106 through a via hole, and a connection point 11*j* of the second line 11*i* is connected with the gate electrode G1 through a via hole. In addition, referring to FIG. 8, the sub pixel at the bottom left corner corresponds to the second data line 3 from left to right; and since another data line (the first data line from left to right) exists between the data line 3 and the corresponding drain electrode D1, the data line 3 cannot be connected with the drain electrode D1 in the corresponding sub pixel directly but via a third line 11*k* in the first electrode layer 1104.

Figure 11:
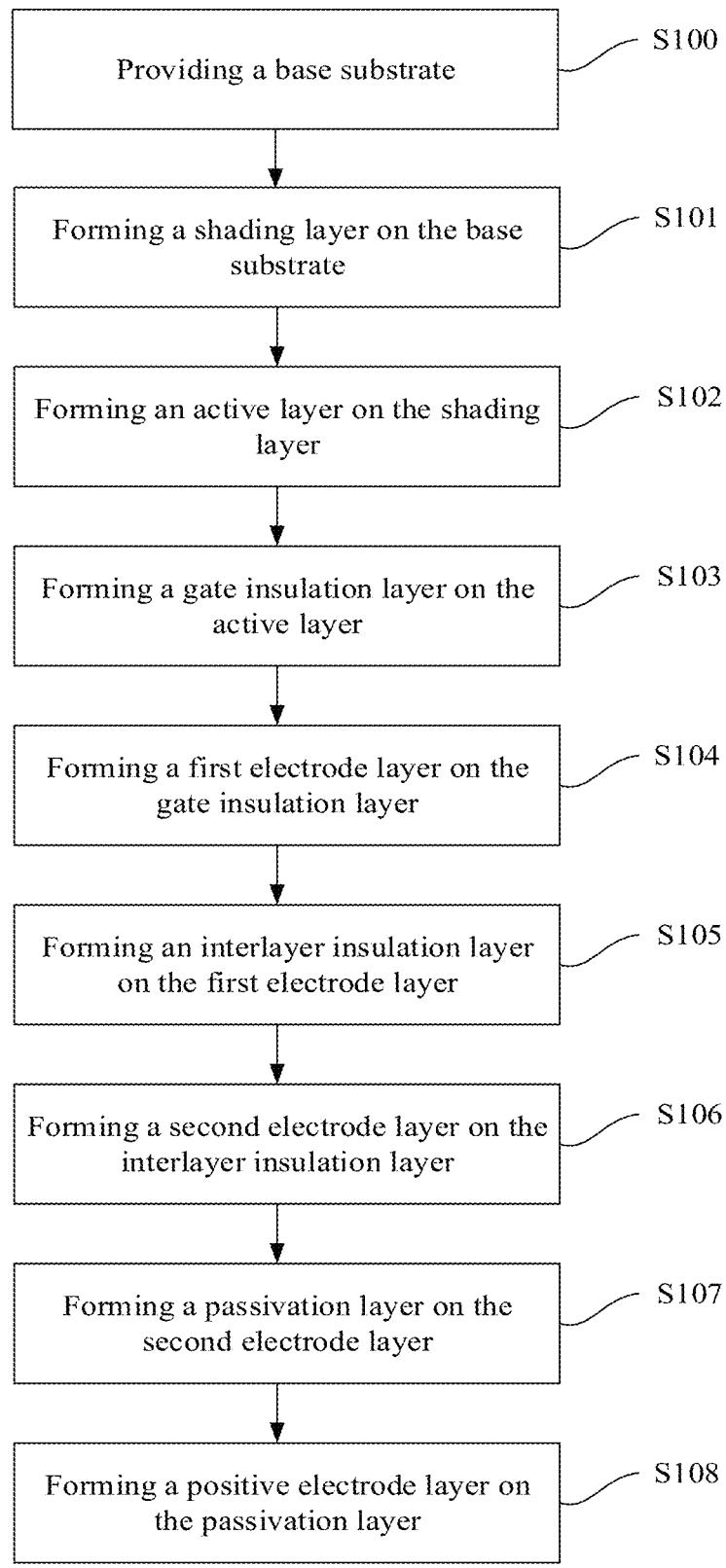
FIG. 11 is a schematic preparation flow diagram of a transparent OLED display panel according to an embodiment of the present disclosure.

FIG. 11 is a schematic preparation flow diagram of a transparent OLED display panel according to an embodiment of the present disclosure. As shown in FIG. 11, in an exemplary embodiment, a preparation method of the transparent OLED display panel includes:

In S100, a base substrate is provided,
wherein, the base substrate is a transparent substrate, such as a glass substrate and the like.

In S101, a shading layer is formed on the base substrate.

In S101, the shading layer may be made of a metal material. On the one hand, the shading layer can play a role of shading, and the shading pattern can shade the parts of the pixels, which have metal lines and surround the parts of the pixels, which are shaded by corresponding metal positive electrodes, so as to prevent light leakage. On the other hand, the shading layer may be reused as metal lines, such as the above-mentioned sense lines. The structure of the shading layer may be seen in the above description of FIG. 10.

In S102, an active layer is formed on the shading layer.

In S102, a thin film of an active material may be formed on the shading layer first. For example, the thin film of the active material may be formed on the shading layer by means of deposition. The thin film of the active material may be at least one of InGaZnO, InGaO, ITZO and AlZnO.

Then, the thin film of the active material is processed by a patterning process to obtain the pattern of the active layer 1102. After the pattern of the active layer 1102 is obtained, some regions in the active layer 1102 may be metallized so that the metallized regions form the source electrodes of the transistors. The structure of the active layer may be seen in the above description of FIG. 9.

Metallization treatment may be carried out in the following way: treatment is carried out for 30-120 min in a reducing atmosphere of 100-300° C., wherein the reducing atmosphere includes hydrogen or hydrogen-containing plasma. Reduction reaction is carried out in the reducing atmosphere of 100-300° C. for 30-120 min, which can ensure to the greatest extent that the regions in the thin film of the active material, which are not covered by an etch stop layer, can be fully and effectively reduced to metal oxide conductors. If the temperature is too low, the reduction effect of the reduction reaction will be affected, and the reaction time will be prolonged, so that the production efficiency is reduced. If the temperature is too high, the regions in a raw thin film, which are not covered by the etch stop layer and do not need to be metallized, are susceptible to chemical actions, thus affecting the structural performance. Likewise, if the time is too short, the reduction reaction will be inadequate, and if the time is too long, the reaction time will be prolonged to reduce the production efficiency.

In S103, a gate electrode insulation layer is formed on the active layer.

In an exemplary embodiment, the gate electrode insulation layer 1103 is formed by means of vapor deposition. The gate electrode insulation layer 1103 may be made from an insulation material, such as silicon nitride, silicon oxide and the like.

In S104, a first electrode layer is formed on the gate electrode insulation layer.

The structure of the first electrode layer may be seen in the above description of FIG. 7.

In S105, an interlayer insulation layer is formed on the first electrode layer.

The interlayer insulation layer 1105 may be formed in the same way as the gate electrode insulation layer 1103.

In S106, a second electrode layer is formed on the interlayer insulation layer.

The structure of the first electrode layer may be seen in the above description of FIG. 8.

In S107, a passivation layer is formed on the second electrode layer.

In an exemplary embodiment, the material of the passivation layer 1107 is a composite layer structure composed of any combination of two or more of silicon oxide, silicon nitride and a silicon nitride compound.

In S108, a positive electrode layer is formed on the passivation layer.

As shown in FIG. 5, the positive electrode layer communicates with the second electrode layer 1106 through a via hole 12.

It should be noted that the regions of different pattern layers, which need to be connected, may be connected through via holes. Therefore, in S102, S105 and S107, via holes may be formed in the interlayer insulation layer 1105 and the passivation layer 1107 that are formed.

Optionally, each sub pixel 11 further includes at least one of a planarization layer 1109 and a buffer layer 1110, wherein the planarization layer 1109 is between the passivation layer 1107 and the positive electrode layer; and the buffer layer 1110 is between the base substrate 10 and the active layer 1102. The buffer layer 1110 is generally a $SiO_2$ and $SiN_x$ layer, and may prevent metal ions in the glass substrate from entering polycrystalline silicon to affect the performance of the thin film transistors. The planarization layer 1109 is generally a resin layer and ensures the flatness between the metal positive electrodes of LEDs and the passivation layer 1107.

An embodiment of the present disclosure provides a display device. The display device includes the transparent OLED display panel described in FIG. 1 to FIG. 10.

In the display device, the four sub pixels of each pixel are connected with the same gate line, so that the number of the gate lines is reduced, the area of the transparent regions occupied by the gate lines is reduced, and the proportion of the transparent regions in the display panel can be increased; at the same time, the gate lines are arranged between the two rows of sub pixels, so that wiring is facilitated, and the uniformity of signals provided by the gate lines to the sub pixels can also be ensured; and in addition, the area of the display regions occupied by the gate lines is reduced, so that more sub pixels can be arranged on the display panel to improve the resolution.

In the embodiments of the present disclosure, the display device includes but is not limited to cell phones, tablet computers, notebook computers, and the like.

An embodiment of the present disclosure further provides a method for driving the transparent OLED display panel described in FIG. 1 to FIG. 10. Taking the case that the sub pixels in each row are arranged in a row direction and the sub pixels in each group are arranged in a column direction for example, the OLED display panel displays a picture frame by frame when in operation, and during the displaying of each frame, displaying is carried out in a row-by-row scanning way. That is, the method may further include:

In a display stage, the thin film transistors of each row of pixels, which are used for displaying, are controlled to be turned on.

When the thin film transistors of one row of pixels, which are used for displaying, are turned on, data signals are written into the sub pixels of the row of pixels respectively to control the luminance of the sub pixels.

Figure 12:
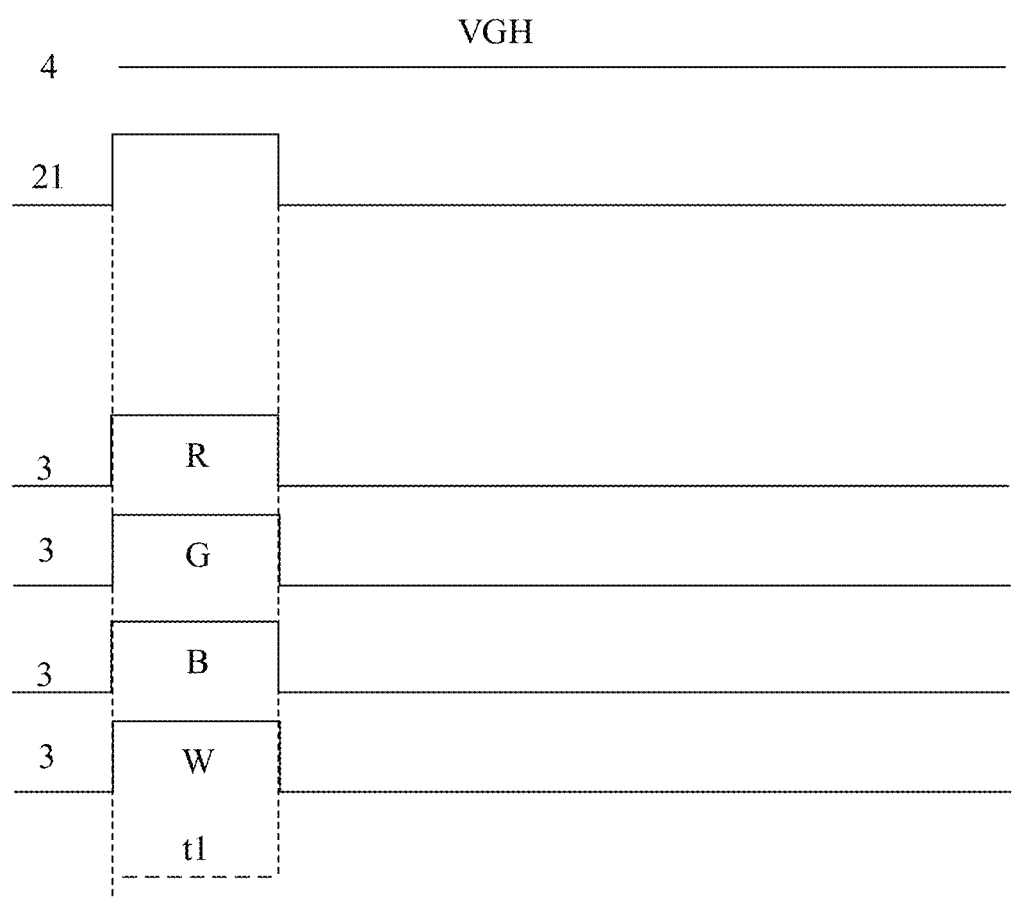
FIG. 12 is a driving timing diagram of a display stage according to an embodiment of the present disclosure.

FIG. 12 is a driving timing diagram of a display stage according to an embodiment of the present disclosure. As shown in FIG. 12, with reference to FIG. 1, FIG. 2 and FIG. 3, in the embodiment of the present disclosure, the case that the pixel shown in FIG. 3 is a target pixel is taken as an example.

In a first period of time t1, scanning signals are provided for the first gate line 21, and data signals are provided for the data lines 3.

The sub pixels within the pixel all acquire the scanning signals, and the sub pixels acquire the data signals via respective corresponding data lines 3 respectively so as to realize simultaneous display of the plurality of sub-pixels.

In a sensing stage, the thin film transistors of each row of pixels, which are used for sensing, are controlled to be turned on.

When the thin film transistors of one row of pixels, which are used for sensing, are turned on, electric signals of the sub pixels are sensed via the sense lines which sense the potentials of the positive electrodes of the OLEDs. Based on the electric signals, an external integrated circuit may figure out a compensation value to perform voltage compensation on the sub pixels.

Figure 13:
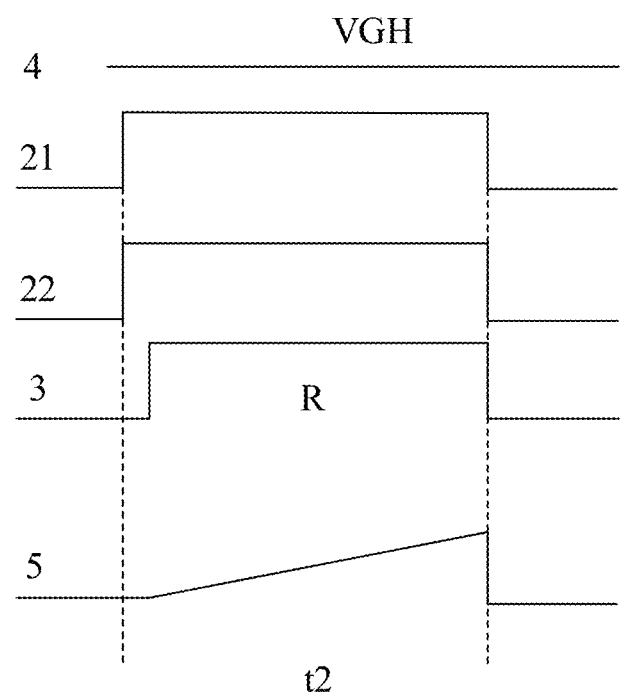
FIG. 13 is a driving timing diagram of a sensing stage according to an embodiment of the present disclosure.

FIG. 13 is a driving timing diagram of a sensing stage according to an embodiment of the present disclosure. As shown in FIG. 13, with reference to FIG. 1, FIG. 2 and FIG. 3, the case that the red first sub pixel is a target sub pixel is taken as an example.

In a second period of time t2, scanning signals are provided for the first gate line 21 and the second gate line 22, and the first transistor T1 and the second transistor T3 are turned on.

The corresponding data line 3 provides a first low level signal for the red first sub pixel, and the low level signal is lower than the turn-on voltage of the second transistor T2 of the first sub pixel, for example, 2V, so that the second transistor T2 is not turned on. The low level signal provided by the data line 3 enters into the sense line 5 via the capacitor C and the third transistor 3, at this moment, the red first sub pixel charges the sense line 5 to enable the sense line to sense the potential of the positive electrode of the OLED, and then the compensation voltage of the first sub pixel can be figured out.

Similar to the data line 3 corresponding to the red first sub pixel, the data line corresponding to the blue first sub pixel provides a second low level signal for the blue first sub pixel to enable the blue first sub pixel to charge the corresponding sense line 5.

It should be noted that the above-mentioned process is only a sense process for one row of sub pixels in the sensing stage, the other rows of sub pixels are sensed in the same way, and the present disclosure will not repeat them here.

Described above are merely the exemplary embodiments of the present disclosure and are not intended to limit the present disclosure. Within the spirit and principle of the present disclosure, any modifications, equivalent substitutions, improvements and the like are within the scope of protection of the present disclosure.

What is claimed is:

1. A display substrate, comprising:
   a base substrate, wherein the base substrate has a plurality of transparent regions and a plurality of display regions, and the transparent regions and the display regions alternate with each other in a first direction;
   a plurality of pixels, wherein the pixels are on the base substrate and within the display regions, pixels which are among the plurality of pixels and within each of the display regions are arranged in a second direction, each of the pixels comprises a plurality of sub pixels, sub pixels in each of the plurality of pixels are divided into two rows of sub pixels, sub pixels in each of the two rows of sub pixels are arranged in the first direction, and the first direction intersects the second direction; and
   a plurality of gate lines and a plurality of data lines, wherein the gate lines and the data lines are on the base substrate, each of the gate lines extends along the first direction, and each of the data lines extends along the second direction;
   wherein sub pixels of a first pixel are connected with the same gate line which is one of the gate lines and comprises a first sub gate line and a second sub gate line, and the first pixel is any one of the plurality of pixels; and, the sub pixels of the first pixel are respectively connected with the first sub gate line, the sub pixels of the first pixel are respectively connected with the second sub gate line, and both the first sub gate line and the second sub gate line are between the two rows of sub pixels of the first pixel.

2. The display substrate according to claim 1, wherein the sub pixels in each of the plurality of pixels are divided into two groups of sub pixels;
   the data lines comprise a plurality of data lines which corresponds to the first pixel and are connected to the sub pixels of the first pixel in one-to-one correspondence; and
   the data lines corresponding to the first pixel are between the two groups of sub pixels, and sub pixels in each of the groups are arranged in the second direction.

3. The display substrate according to claim 2, wherein the display substrate further comprises:
   a plurality of power supply signal lines, wherein each of the power supply signal lines extends along the second direction; and
   the sub pixels of the first pixel are connected with the same power supply signal line which is among the power supply signal lines and is between the two groups of sub pixels of the first pixel.

4. The display substrate according to claim 3, wherein data lines connected with different groups of sub pixels of the first pixel are arranged on different sides of the power supply signal line connected with the sub pixels of the first pixel.

5. The display substrate according to claim 4, wherein data lines on a first side of the power supply signal line are connected with a group of sub pixels on the first side of the power supply signal line, respectively, and the first side of the power supply signal line is any side of the power supply signal line.

6. The display substrate according to claim 3, wherein each of the sub pixels comprises an active layer, a first electrode layer and a second electrode layer, which are stacked in sequence and insulated from one another; the first electrode layer and the second electrode layer are one of a gate electrode layer and a source-drain electrode layer, respectively; and
   the power supply signal line comprises two sub layers, and the two sub layers are on the same layer as the first electrode layer and the second electrode layer, respectively.

7. The display substrate according to claim 1, wherein the display substrate further comprises:
   a plurality of sense lines, wherein each of the sense lines extends along the second direction;

and, the sub pixels of the first pixel are connected with the same sense line which is among the sense lines and is between the first pixel and a neighboring pixel of the first pixel.

8. The display substrate according to claim 7, wherein the display substrate further comprises:
a plurality of sense leads, wherein the sub pixels of the first pixel are connected with the same sense line through one sense lead, respectively.

9. The display substrate according to claim 8, wherein the display substrate further comprises:
a shading pattern, wherein the shading pattern is on the base substrate;
and, the sense leads are on the same layer as the shading pattern.

10. The display substrate according to claim 1, wherein each of the sub pixels in the first pixel comprises a pixel circuit and a light-emitting unit;
the pixel circuit comprises a first transistor, a second transistor, a third transistor and a capacitor;
a control electrode of the first transistor is electrically connected with the first sub gate line; a first electrode of the first transistor is electrically connected with one of the data lines; a second electrode of the first transistor is electrically connected with a control electrode of the second transistor and one end of the capacitor, respectively; a first electrode of the second transistor is electrically connected with a power supply signal line; a second electrode of the second transistor is electrically connected with a second electrode of the third transistor, the other end of the capacitor and the light-emitting unit, respectively; a control electrode of the third transistor is electrically connected with the second sub gate line; and a first electrode of the third transistor is electrically connected with a sense line.

11. The display substrate according to claim 1, wherein the sub pixels of each pixel comprise a red sub pixel, a green sub pixel, a blue sub pixel and a white sub pixel.

12. A display device, wherein the display device comprises a display substrate, and the display substrate comprises:
a base substrate, wherein the base substrate has a plurality of transparent regions and a plurality of display regions, and the transparent regions and the display regions alternate with each other in a first direction;
a plurality of pixels, wherein the pixels are on the base substrate and within the display regions, pixels which are among the plurality of pixels and within each of the display regions are arranged in a second direction, each of the pixels comprises a plurality of sub pixels, sub pixels in each of the plurality of pixels are divided into two rows of sub pixels, sub pixels in each of the two rows of sub pixels are arranged in the first direction, and the first direction intersects the second direction; and
a plurality of gate lines and a plurality of data lines, wherein the gate lines and the data lines are on the base substrate, each of the gate lines extends along the first direction, and each of the data lines extends along the second direction;
wherein sub pixels of a first pixel are connected with the same gate line which is one of the gate lines and comprises a first sub gate line and a second sub gate line, and the first pixel is any one of the plurality of pixels; and, the sub pixels of the first pixel are respectively connected with the first sub gate line, the sub pixels of the first pixel are respectively connected with the second sub gate line, and both the first sub gate line and the second sub gate line are between the two rows of sub pixels of the first pixel.

13. The display device according to claim 12, wherein the sub pixels in each of the plurality of pixels are divided into two groups of sub pixels;
the data lines comprise a plurality of data lines which corresponds to the first pixel and are connected to the sub pixels of the first pixel in one-to-one correspondence; and
the data lines corresponding to the first pixel are between the two groups of sub pixels, and sub pixels in each of the groups are arranged in the second direction.

14. The display device according to claim 13, wherein the display substrate further comprises:
a plurality of power supply signal lines, wherein each of the power supply signal lines extends along the second direction; and
the sub pixels of the first pixel are connected with the same power supply signal line which is among the power supply signal lines and is between the two groups of sub pixels of the first pixel.

15. The display device according to claim 14, wherein data lines connected with different groups of sub pixels of the first pixel are arranged on different sides of the power supply signal line connected with the sub pixels of the first pixel.

16. The display device according to claim 15, wherein data lines on a first side of the power supply signal line are connected with a group of sub pixels on the first side of the power supply signal line, respectively, and the first side of the power supply signal line is any side of the power supply signal line.

17. The display device according to claim 14, wherein each of the sub pixels comprises an active layer, a first electrode layer and a second electrode layer, which are stacked in sequence and insulated from one another; the first electrode layer and the second electrode layer are one of a gate electrode layer and a source-drain electrode layer, respectively; and
the power supply signal line comprises two sub layers, and the two sub layers are on the same layer as the first electrode layer and the second electrode layer, respectively.

18. The display device according to claim 12, wherein the display substrate further comprises:
a plurality of sense lines, wherein each of the sense lines extends along the second direction;
and, the sub pixels of the first pixel are connected with the same sense line which is among the sense lines and is between the first pixel and a neighboring pixel of the first pixel.

19. The display device according to claim 18, wherein the display substrate further comprises:
a plurality of sense leads, wherein the sub pixels of the first pixel are connected with the same sense line through one sense lead, respectively.

20. The display device according to claim 19, wherein the display substrate further comprises:
a shading pattern, wherein the shading pattern is on the base substrate;
and, the sense leads are on the same layer as the shading pattern.

* * * * *